United States Patent
Soer et al.

(10) Patent No.: US 11,145,793 B2
(45) Date of Patent: Oct. 12, 2021

(54) LIGHT EMITTING DIODE WITH HIGH MELANOPIC SPECTRAL CONTENT

(71) Applicant: Lumileds LLC, San Jose, CA (US)

(72) Inventors: Wouter Soer, Eindhoven (NL); Gregory Tashjian, San Jose, CA (US)

(73) Assignee: LUMILEDS LLC, San Jose, CA (US)

(*) Notice: Subject to any disclaimer, the term of this patent is extended or adjusted under 35 U.S.C. 154(b) by 0 days.

(21) Appl. No.: 16/686,456

(22) Filed: Nov. 18, 2019

(65) Prior Publication Data

US 2020/0357958 A1 Nov. 12, 2020

Related U.S. Application Data

(60) Provisional application No. 62/845,474, filed on May 9, 2019.

(51) Int. Cl.
| | |
|---|---|
| *H01L 33/50* | (2010.01) |
| *H01L 25/075* | (2006.01) |
| *H01L 33/62* | (2010.01) |
| *H01L 33/60* | (2010.01) |
| *H01L 33/48* | (2010.01) |

(52) U.S. Cl.
CPC ........ *H01L 33/504* (2013.01); *H01L 25/0753* (2013.01); *H01L 33/486* (2013.01); *H01L 33/60* (2013.01); *H01L 33/62* (2013.01)

(58) Field of Classification Search
CPC ..... H01L 33/48–648; H01L 2933/0041; H01L 27/156; H01L 2933/0033; H01L 25/167; H01L 2933/005; H01L 2933/0066–0091
USPC .......................................................... 257/88
See application file for complete search history.

(56) References Cited

U.S. PATENT DOCUMENTS

| | | | |
|---|---|---|---|
| 10,747,056 B2* | 8/2020 | Yang | G02F 1/133603 |
| 2016/0161067 A1* | 6/2016 | Oepts | C09K 11/663 |
| | | | 362/84 |
| 2018/0056027 A1* | 3/2018 | Peeters | F21V 9/30 |
| 2019/0088831 A1* | 3/2019 | Murofushi | H01L 27/156 |
| 2019/0088835 A1* | 3/2019 | Yokota | H01L 33/62 |
| 2019/0103523 A1 | 4/2019 | Choi et al. | |

FOREIGN PATENT DOCUMENTS

| | | | |
|---|---|---|---|
| EP | 3271013 | 1/2018 | |
| EP | 3271013 B1 * | 8/2018 | F21K 9/64 |
| WO | 2016/146681 A1 | 9/2016 | |

OTHER PUBLICATIONS

From the EPO as the ISA, Notification of Transmittal of the International Search Report and the Written Opinion of the International Searching Authority, PCT/US2020/031587, dated Nov. 5, 2020, 19 pages.

* cited by examiner

*Primary Examiner* — Mohammad M Hoque

(57) ABSTRACT

This specification discloses lighting device the includes a combination of a royal-blue and blue pump LEDs with a mixture of phosphors to provide light with a high melanopic content and maximize an m/p ratio while maintaining high color fidelity, and a tunable lighting system including the lighting device.

19 Claims, 10 Drawing Sheets

LIGHT EMITTING DIODE WITH HIGH MELANOPIC SPECTRAL CONTENT

CROSS REFERENCE TO RELATED APPLICATION

This application claims the benefit of U.S. provisional application No. 62/845,474, filed May 9, 2019, which is incorporated by reference in its entirety.

FIELD OF THE INVENTION

The disclosure relates generally to lighting devices, and in particular to lighting devices having a high melanopic spectral content, and to tunable lighting systems using such lighting devices.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors.

SUMMARY

In one aspect, a lighting device as disclosed herein may include a light source, the light source including a royal-blue light source configured to emit a royal-blue light with a peak wavelength range of 435-460 nm and a blue light source configured to emit light with a peak wavelength range of 470-496 nm; a wavelength converting structure disposed in a path of the royal-blue light and the blue light, the wavelength converting structure including: a green phosphor, the green phosphor configured to absorb a first portion of at least one of the royal-blue light and the blue light, and to down-convert the first portion to green light; and a red phosphor configured to absorb at least one of a second portion of at least one of the royal-blue light and the blue light and a portion of the green light and to down-convert the at least one of the second portion and the portion of the green light to red light; the wavelength converting structure configured to emit a second light, the second light including the green light, the red light, an unconverted portion of the royal-blue light, and an unconverted portion of the blue light.

The lighting device may include a second blue light source configured to emit light with a peak wavelength range of 470-496 nm.

A ratio of radiant flux of blue light having a wavelength range of 465 to 495 nm to radiant flux of royal-blue light having a wavelength in the range of 435 to 465 nm in the second light of the lighting device may be between 0.9 and 2.0.

The royal-blue light source of the lighting device may be a royal-blue LED and the blue light source of the lighting device may be a blue LED.

The lighting device may additionally include a lead frame cup package, the royal-blue LED and blue LED may be both mounted inside the lead frame cup package, the wavelength converting structure may be disposed over the royal-blue LED and blue LED within the lead frame cup package. The royal-blue LED and the blue LED in the lead frame cup package may be electrically connected in series.

An m/p ratio of the second light in the lighting device may be greater than an m/p ratio of the CIE daylight illuminant at a corresponding CCT value.

The second light may have a maximum spectral power density between 447 nm 447 and 531 nm. The second light may have a maximum spectral power density between 465 and 515 nm.

A CCT value of the second light may be 4000K or greater, and a color rendering index of the second light may have an Ra value greater than 80.

In another aspect, a tunable lighting system as disclosed herein may include a first lighting device configured to emit a first light, the first light having a first m/p ratio; and a second lighting device configured to emit a second light, the second light having a second m/p ratio that is smaller than the first m/p ratio, the tunable lighting system being configured to emit a third light, the third light including at least one of the first light, the second light, or a combination of the first light and the second light, the first lighting device may include: a light source, the light source including a royal-blue light source configured to emit a royal-blue light with a peak wavelength range of 435-460 nm and a blue light source configured to emit light with a peak wavelength range of 470-496 nm; a wavelength converting structure disposed in a path of the royal-blue light and the blue light, the wavelength converting structure including: a green phosphor, the green phosphor configured to absorb a first portion of at least one of the royal-blue light and the blue light, and to down-convert the first portion to green light; and a red phosphor configured to absorb at least one of a second portion of at least one of the royal-blue light and the blue light and a portion of the green light, and to down-convert the at least one of the second portion and the portion of the green light to red light; the wavelength converting structure being configured to emit the first light, the first light including the green light, the red light, an unconverted portion of the royal-blue light, and an unconverted portion of the blue light.

In the tunable lighting system, the royal-blue light source may be a royal-blue LED, the blue light source may be a blue LED, and the second lighting device may be violet pumped LED.

In the tunable lighting system, the first lighting device may further include a lead frame cup package, the royal-blue LED and blue LED may both be mounted inside the lead frame cup package, and the wavelength converting structure may be disposed over the royal-blue LED and blue LED within the lead frame cup package.

These and other embodiments, features and advantages of the present invention will become more apparent to those skilled in the art when taken with reference to the following more detailed description in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

The human circadian rhythm is a twenty-four hour cycle in the human physiological process and includes any biological process that displays an endogenous and entrainable oscillation. Entrainment is the interaction between circadian rhythms and the environment, such as the entrainment of circadian rhythms to the daily light-dark cycle determined by the earth's rotation.

Light-induced circadian entrainment and other non-visual responses to light are influenced by a photoreceptor as well as rod and cone structures in the eye. Together, these non-visual responses to light can produce a day-like physiological state in the body.

Figure 1:
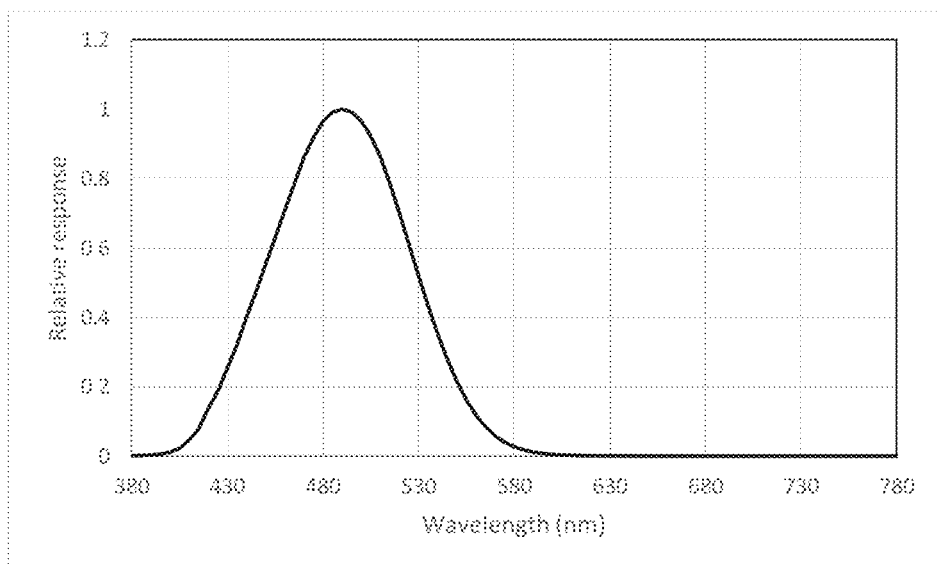
FIG. 1 shows the melanopic response curve.

Light-induced circadian entrainment generally has a peak spectral sensitivity in the short-wavelength end of the visual spectrum. This range correlates with the action spectrum for melanopsin, which is the photopigment in the eye expressed by the photoreceptor responsible for light-induced circadian entrainment. FIG. 1 shows the melanopic response curve, which peaks at approximately 490 nm and has a full width at half maximum (FWHM) in the range of 447-531 nm including prereceptoral filtering, as defined in CIE S026/E: 2018.

In many lighting application, it is desirable to be able to vary the melanopic illuminance of the emitted spectrum using a tunable lighting system so as to provide conditions suitable for circadian entrainment and to minimize circadian disruption. At a given photopic illuminance, the melanopic illuminance can be tuned by changing the correlated color temperature ("CCT") using conventional white LED spectra. Alternatively, the spectrum of the emitted light may be engineered to create either a gap or a peak at the wavelength ranges coinciding with the melanopic peak sensitivity. Such gaps and peaks may be referred to herein as a "cyan gap" or a "cyan peak." To maximize the melanopic tuning range, both approaches may be combined, i.e. at one end of the tuning range, the spectrum may be cool-white with a cyan peak, while at the other end of the range, the spectrum may be warm-white with a cyan gap.

A useful metric to describe these spectra is the m/p ratio. The "m/p ratio" is defined as the ratio of radiant flux weighted by the melanopic wavelength response ("m") to the radiant flux weighted by photopic wavelength response ("p"), where the melanopic and photopic wavelength responses are normalized such that m/p=1 for an equal energy spectrum ("EES"). Using the m/p ratio normalizes the melanopic stimulation to the visual (photopic) stimulation. Thus, a lighting system at a maximum m/p ratio maximizes melanopic stimulation, while a lighting system at a minimum m/p ratio minimizes melanopic stimulation at a given retinal illuminance.

Conventional pcLEDs employing a royal-blue pump LED are not optimal for use in tunable lighting systems which vary melanopic illuminance because the spectra required for such tunable lighting systems to have both a maximum tunable range of the m/p ratio and good color rendering cannot be achieved. The emission peak wavelength of a pcLED employing a royal-blue pump LED is 440-460 nm, which has significant overlap with the melanopic sensitivity function (447-531 nm FWHM), prohibiting the design of a tunable lighting system that has a minimized m/p ratio. The royal-blue emission peak from the royal-blue pump LED is also not optimal for the design of a tunable lighting system which has a maximized m/p ratio, as the royal-blue emission peak has a significant offset in peak position relative to the melanopic sensitivity function.

Minimizing the m/p ratio may be achieved by the use of violet pump LEDs, which have a peak wavelength between 410-430 nm. Such violet pump LEDs have been proposed, and demonstrated (e.g. as disclosed in U.S. Pat. No. 9,410,664) as a way to minimize m/p ratio while maintaining a (warm) white color point.

Maximizing the m/p ratio is more difficult. Shifting the pump LED to match the melanopic peak is not a practical solution as it reduces the color fidelity to values that are typically unacceptable. The use of cyan phosphors to down-convert the royal-blue peak to match the melanopic sensitivity is also not practically possible because of the lack of efficient and reliable cyan phosphors with the desired narrow emission spectrum.

Figure 2:
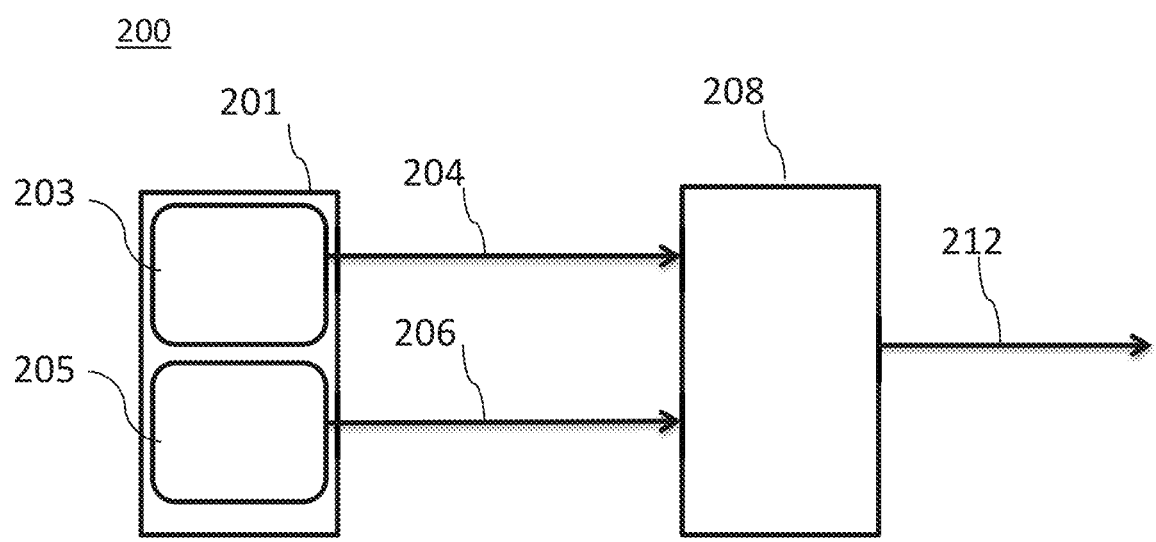
FIG. 2 shows an embodiment of a lighting device with a maximized m/p ratio and high color fidelity.

FIG. 2 shows an embodiment of a lighting device with a maximized m/p ratio and high color fidelity. Lighting device 200 of FIG. 2 includes a light source 201 which is a combination of a royal-blue light source 203 with a peak wavelength in the range of 435-460 nm and a blue light source 205 with a peak wavelength in the range of 470-495 nm.

Lighting device 200 of FIG. 2 also includes a wavelength converting structure 208 which includes a phosphor mixture containing at least one green phosphor and at least one red phosphor.

Light source 201 emits a first royal-blue light 204 from royal-blue light source 203 and a first blue light 206 from blue light source 205. Portions of first royal-blue light 204 and first blue light 206 are incident upon wavelength converting structure 208. The green phosphor and red phosphor in the wavelength converting structure 208 absorb the first royal-blue light 204 and/or first blue light 206 and emit a second light 212. Second light 212 may include light down-converted by the green phosphors into the green spectral range (495-580 nm, which includes cyan, green and yellow) and light down-converted from the red phosphor into the red spectral range (580-660 nm, which includes amber, red-orange, red and deep red). Second light 212 may also include a portion of the first royal-blue light 204 and first blue light 206 which is not down-converted. As used herein, a "green phosphor" is any material capable of absorbing blue and/or royal-blue light, and down-converting the absorbed light into light having a peak wavelength within a green spectral range (495-580 nm). As used herein, a "red phosphor" is any material capable of absorbing blue and/or royal-blue light and/or green light, and down converting the absorbed light into light having a peak wavelength within a red spectral range (580-660 nm). Thus, in addition, or as an alternative, to absorbing a portion of the first royal-blue light 204 and/or first blue light 206, the red phosphor may absorb a portion of the light that has been down-converted from the green phosphor into the green spectral range, which the red phosphor then down-converts into the red spectral range in second light 212.

Figure 3:
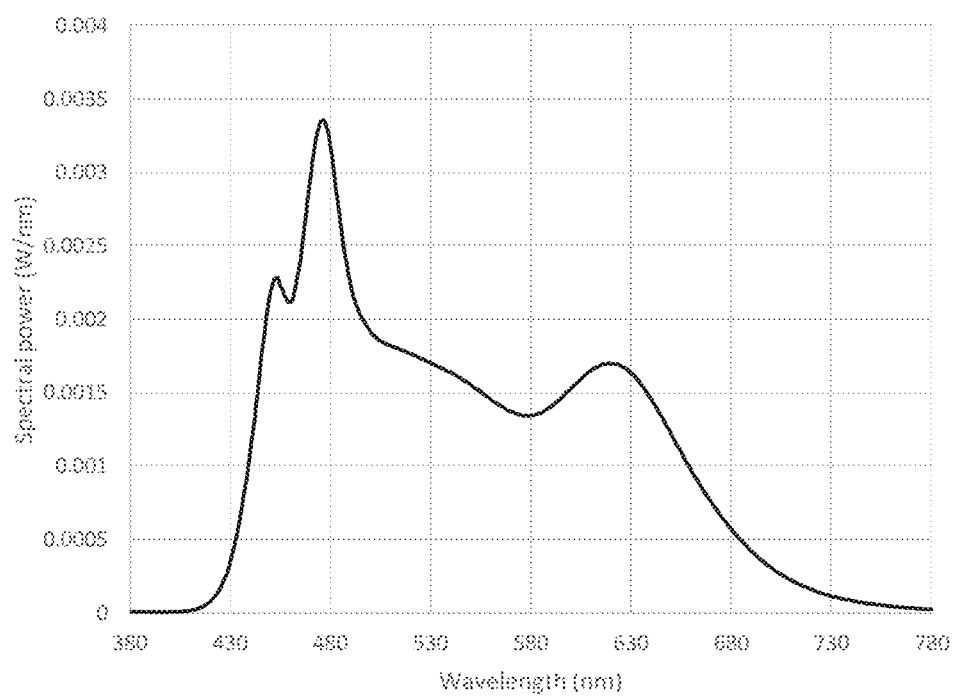
FIG. 3 shows a model spectrum of an embodiment of a lighting device according to the disclosure.

FIG. 3 shows a model spectrum of an embodiment of a lighting device 200 according to the disclosure. The model spectrum of FIG. 3 was generated by mixing emission spectra of a royal-blue LED with peak wavelength of 451 nm, a blue LED with peak wavelength of 475 nm, a green garnet phosphor and a red SCASN phosphor to a color point of u'=0.195 and v'=0.470. The ratio of unconverted blue radiant flux and unconverted royal-blue radiant flux used was 2.0. The spectrum shows a peak at 475 nm, which is within the full width at half maximum (FWHM) range of 447-531 of the melanopic response curve (FIG. 1). In general, the lighting device disclosed herein may have a peak within the range of 447-531 nm, and more specifically may have a peak within the range of 465-515 nm. The resulting device has a CCT of 6587K, a color rendering index ("CRT") Ra of 84, and an m/p ratio of 1.27.

In general a lighting device 200 according to the disclosure may have a CCT of 4000K or higher, or 5000K or higher. A lighting device 200 according to the disclosure may have a CRT Ra>80. A lighting device 200 according to the disclosure may have an m/p ratio that is greater than the m/p ratio of the CIE daylight illuminant with corresponding CCT.

Light sources 203 and 205 may be LEDs or any other suitable light sources including, as examples, resonant cavity light emitting diodes (RCLEDs) and vertical cavity laser diodes (VCSELs). Light sources 203 and 205 may be LED dies, for example III-nitride LEDs based on the InGaN material system.

Phosphors used in phosphor converting structure 208 may be any suitable green phosphor and any suitable red phosphor.

Examples of green phosphors that may be used in converting structure 208 include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<$, $0<z\le0.1$, $0<a\le0.2$ and $0<b\le0.1$, such as $Lu_3Al_5O_{12}:Ce^{3+}$ and $Y_3Al_5O_{12}:Ce^{3+}$ which emit light in the yellow-cyan range. Additional examples of suitable green phosphors include but are not limited to $Lu_{3-x-y}M_yAl_{5-z}A_zO_{12}:Ce_x$ where M=Y, Gd, Tb, Pr, Sm, Dy; A=Ga, Sc; and ($0<x\le0.2$); $Ca_{3-x-y}M'Sc_{2-z}A_zSi_3O_{12}:Ce_x$ where M=Y, Lu; A=Mg, Ga; and ($0<x\le0.2$); $Ba_{2-x-y}M_ySiO_4:Eu_x$ where M=Sr, Ca, Mg and ($0<x\le0.2$); $Ba_{2-x-y-z}M_yK_zSi_{1-z}P_zO_4:Eu_x$ where M=Sr, Ca, Mg and ($0<x\le0.2$); $Sr_{1-x-y}M_yAl_{2-z}Si_zO_{4-z}N_z:Eu_x$ where M=Ba, Ca, Mg and ($0<x\le0.2$); $M_{1-x}Si_2O_2N_2:Eu_x$ where M=Sr, Ba, Ca, Mg and ($0<x\le0.2$); $M_{3-x}Si_6O_9N_4:Eu_x$ where M=Sr, Ba, Ca, Mg and ($0<x\le0.2$); $M_{3-x}Si_6O_{12}N_2:Eu_x$ where M=Sr, Ba, Ca, Mg and ($0<x\le0.2$); $Sr_{1-x-y}M_yGa_{2-z}Al_zS_4:Eu_x$ where M=Ba, Ca, Mg and ($0<x\le0.2$); $Ca_{1-x-y-z}M_zS:Ce_xA_y$ where M=Ba, Sr, Mg; A=K, Na, Li; and ($0<x\le0.2$); $Sr_{1-x-z}M_zAl_{1+y}Si_{4.2-y}N_{7-y}O_{0.4+y}:Eu_x$ where M=Ba, Ca, Mg and ($0<x\le0.2$); $Ca_{1-x-y-z}M_ySc_2O_4:Ce_xA_z$ where M=Ba, Sr, Mg; Na, Li; and ($0<x\le0.2$); $M_{x-z}Si_{6-y-2x}Al_{y+2x}O_yN_{8-y}:Eu_z$ where M=Ca, Sr, Mg and ($0<x\le0.2$); and $Ca_{8-x-y}M_yMgSiO_4Cl_2:Eu_x$ where M=Sr, Ba and ($0<x\le0.2$).

Examples of red phosphors that may be used in converting structure 208 include $(Sr_{1-x-y}Ba_xCa_y)_{2-z}Si_{5-a}Al_aN_{8-a}O_a:Eu_z^{2+}$ wherein $0\le a<5$, $0<x\le1$, $0\le y\le1$, and $0<z\le1$, such as $Sr_2Si_5N_8:Eu^{2+}$, which emit light in the red range. Additional examples of suitable red emitting phosphors include $Ca_{1-x-z}M_zS:Eu_x$ where M=Ba, Sr, Mg, Mn and ($0<x\le0.2$); $Ca_{1-x-y}M_ySi_{1-1}Al_{1+z}N_{3-z}O_z:Eu_x$ where M=Sr, Mg, Ce, Mn and ($0<x\le0.2$), $Mg_4Ge_{1-x}O_5F:Mn_x$ where ($0<x\le0.2$); $M_{2-x}Si_{5-y}Al_yN_{8-y}O_y:Eu_x$ where M=Ba, Sr, Ca, Mg, Mn and ($0<x\le0.2$); $Sr_{1-x-y}M_ySi_{4-z}Al_{1+z}N_{7-z}O_z:Eu_x$ where M=Ba, Ca, Mg, Mn and ($0<x\le0.2$); and $Ca_{1-x-y}M_ySiN_2:Eu_x$ where M=Ba, Sr, Mg, Mn and ($0<x\le0.2$).

Other cyan, yellow, and red emitting phosphors may also be suitable, including $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0<x<1$ including, for example, $CaS:Eu^{2+}$ and $SrS:Eu^{2+}$.

In an example embodiment of lighting device 200, wavelength converting structure 208 may include the green phosphor $(Lu_{1-x-y-a-b}Y_xGd_y)_3(Al_{1-z}Ga_z)_5O_{12}:Ce_aPr_b$ and the red phosphor is $(S_{1-x-y}Ba_xCa_y)_{2-z}Si_{5-a}Al_aN_{8-a}O_a:Eu_z^{2+}$. In this particular example, the ratio of the amount of green phosphor to red phosphor may be approximately 21:1. In general, however, the relative amount of green phosphor and red phosphor used in wavelength converting structure 208 depends on many factors including, for example, the type of phosphor, the particle size and scattering cross-section of the phosphor particles, and any structure in the phosphor layers. A person of ordinary skill in the art would know the proportions of green phosphor and red phosphor to include in the phosphor converting structure 208 to achieve a target white light.

Figure 4:
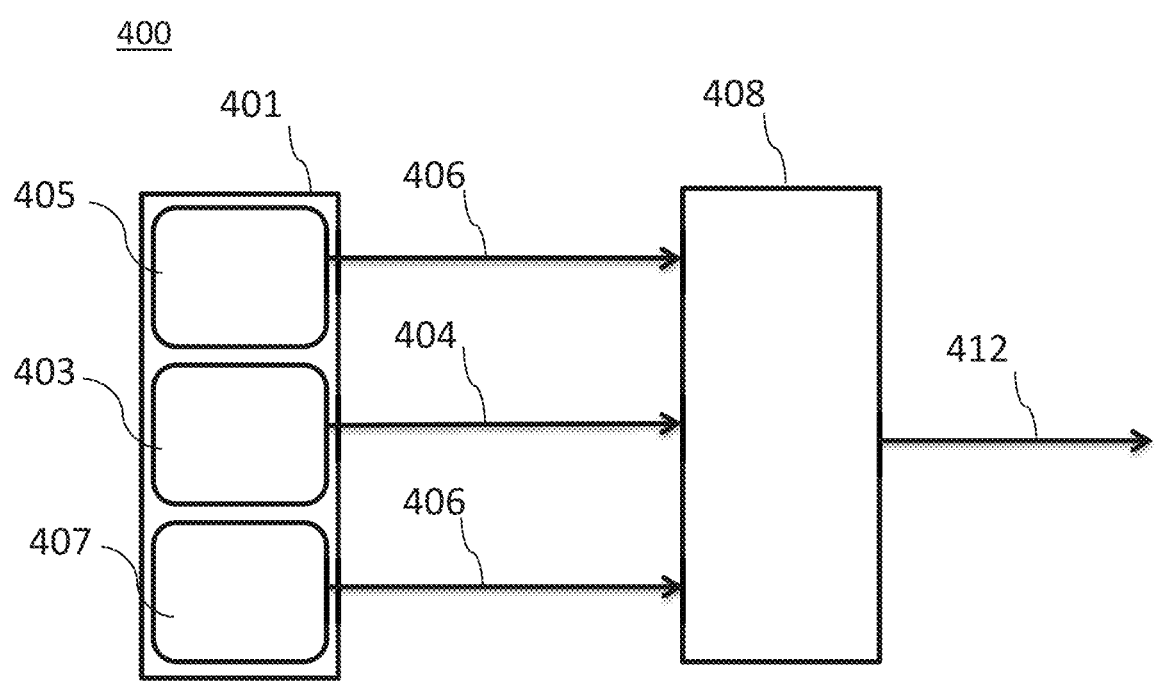
FIG. 4 shows another embodiment of a lighting device with a maximized m/p ratio and high color fidelity.

FIG. 4 shows another embodiment of a lighting device with a maximized m/p ratio and high color fidelity, and having increased unconverted radiant flux of blue light relative to unconverted radiant flux of royal-blue light as compared to the embodiment disclosed in FIG. 2.

Lighting device 400 of FIG. 4 includes a light source 401 which is a combination of a royal-blue light source 403 with a peak wavelength in the range of 435-460 nm and two blue light sources 405, 407, each with a peak wavelength in the range of 470-495 nm.

Lighting device 400 of FIG. 4 also includes a wavelength converting structure 408 which includes a phosphor mixture containing at least one green phosphor and at least one red phosphor.

Light source 401 emits a first royal-blue light 404 from royal-blue light source 403 and a first blue light 406 from blue light sources 405, 407. Portions of first royal-blue light 404 and first blue light 406 are incident upon wavelength converting structure 408. The wavelength converting structure 408 absorbs the first royal-blue light 404 and first blue light 406 and emits a second light 412. Second light 412 may include light down-converted by the phosphors as well as a portion of the first royal-blue light 404 and first blue light 406 which is not down-converted.

Because light source 401 includes two blue light sources, there is more unconverted radiant flux of blue light than unconverted radiant flux of royal-blue light. When the amount of blue light is low relative to royal-blue light, a lighting device as disclosed herein may not provide the desired normalized melanopic flux. Whereas when the amount of blue light is high relative to the amount of royal-blue light, a lighting device as disclosed herein may not have enough royal-blue spectral content to meet color rendering criteria. There is some tolerance in the relative flux of the blue and royal-blue light, as the final color point is determined partly by the phosphor mixture. The unconverted radiant flux of the blue light relative to the royal-blue light may be between 0.7 and 2.8. Unconverted radiant flux may be difficult to measure in the emitted light (second light 412), therefore a more practical ratio is the ratio of radiant flux of blue light having a wavelength range of 465 to 495 nm to radiant flux of royal-blue light having a wavelength in the range of 435 to 465 nm in the second light 412 of the lighting device 400, which ratio may be between 0.9 and 2.0.

FIG. 4 illustrates one method for adjusting the relative unconverted radiant flux of blue vs. royal-blue light, by using an additional blue light source. Alternatively (or additionally), the relative amount of blue light to royal-blue light in the second light 212, 412 can be adjusted by, for example, driving the blue light source 206, 405, 407 at a higher drive current than the royal-blue light source 204, 403 or by using a higher concentration of the green phosphor and/or red phosphor in an area of the wavelength converting structure 208, 408 positioned around the royal-blue light source 204, 403 than in an area positioned around the blue light source 206, 405, 407. A person having ordinary skill in the art will understand that any suitable method to adjust relative unconverted radiant flux of blue to royal-blue light may be used to achieve the ratio needed to provide maximum m/p while maintaining high color fidelity.

Figure 5:
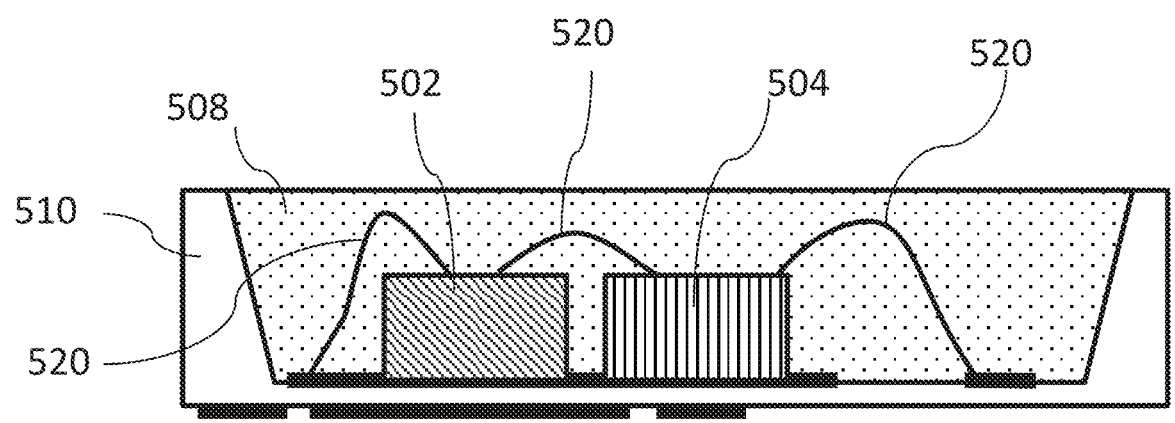
FIG. 5 shows an embodiment of a lighting device according to the disclosure formed in a single lead frame cup package.

FIG. 5 shows an embodiment of a lighting device according to the disclosure formed in a single lead frame cup package. Lighting device 500 of FIG. 5 includes a blue LED die 502 and a royal-blue LED die 504 in a single lead frame cup package 510. The green phosphor and red phosphor mixture are combined in a silicone slurry which is filled into the cup package 510 over the blue LED die 502 and royal-blue LED die 504 to form wavelength converting structure 508. In other embodiments, each LED die may have its own phosphor mixture in wavelength converting structure 508, or wavelength converting structure 508 may cover only one of the royal-blue and blue LED die.

In lighting device 500, the blue LED die 502 and royal-blue LED die 504 are in a fixed electrical configuration such that the LED has a single cathode and anode. Wires 520 connect the two LED dies 502, 504 in a series configuration. In such a series configuration there is a single drive current for both LED dies 502, 504, thus defining their relative power, which is important for controlling the overall spectrum and color point, as described above. The relative power may be changed by changing the number of royal-blue LED dies and blue LED dies that are placed in series. For example, the lead frame cup package may contain one royal-blue LED die and two blue LED dies.

In another embodiment, the royal-blue LED die and blue LED die may be electrically connected in parallel. In a parallel configuration, the relative power is determined by the current at which the voltage of each of the LED die types are in equilibrium.

Figure 6:
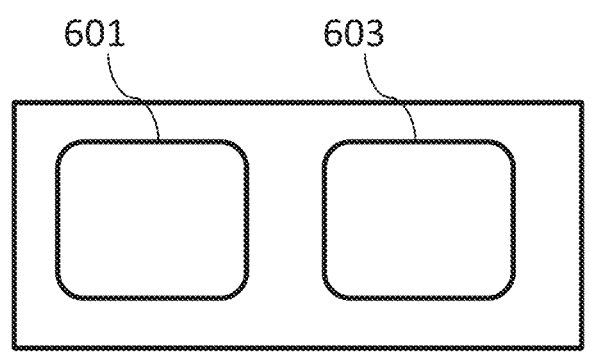
FIG. 6 shows an embodiment of a tunable lighting system incorporating the lighting device disclosed herein.

FIG. 6 shows an embodiment of a tunable lighting system incorporating the lighting device disclosed herein. Tunable lighting system 600 of FIG. 6 includes a first lighting device 601, which is a the cool-white lighting device having a maximum m/p ratio, such as lighting devices 200 and 400 as disclosed herein, and a second lighting device 603, which may be a warm-white lighting device having a minimum m/p ratio, such as, for example, the violet pumped LED disclosed in U.S. Pat. No. 9,410,664, incorporated herein by reference. In tunable lighting system 600, the first lighting device 601, which is a cool-white lighting device, may have an m/p ratio that is greater than a reference illuminant of the same CCT; and the second lighting device 603, which is a warm-white lighting device, may have an m/p ratio that is less than a reference illuminant of the same CCT; where the reference illuminant may be a blackbody radiator or the CIE daylight illuminant. In one example, first lighting device 601 may have an m/p ratio of 1.27 and second lighting device 603 may have an m/p ratio of 0.37.

Tunable lighting system 600 may be implemented at package level, for example in a lead frame package with two cups, one for the cool-white, maximum m/p LED such as those disclosed herein, and one for the warm-white, minimum m/p LED. Alternatively, tunable lighting system 600 may be implemented at module level, with discrete LED packages for both warm-white, minimum m/p LED 603 and cool-white, maximum m/p LED 601.

The light emitted from the tunable lighting system 600 may be a combination of light emitted from the first lighting device 601 and the second lighting device 603, and the CCT and m/p ratio of the light emitted from tunable lighting system 600 may be varied by varying the amount of light emitted by each lighting device. For example, when the first lighting device 601 is in an on state and the second lighting device 603 is in the off state, the emitted light may be a cool-white light having a maximum m/p ratio. When the first lighting device 601 in an off state and the second lighting device 603 is in an on state, the light emitted may be a warm white having a minimum m/p ratio. When both the first lighting device 601 and the second lighting device 603 are in the on state, the light emitted from the lighting system 600 is a mixture of the light emitted from the first lighting device 601 and second lighting device 603.

FIGS. 7, 8, 9 and 10 show results for an example embodiment of tunable lighting system 600, in which the warm-white, minimum m/p LED 603, such as the violet-pumped LED, has a CCT of 2700K, and the cool-white, maximum m/p LED 601, such as those disclosed herein, has a CCT of 6500K.

Figure 7:
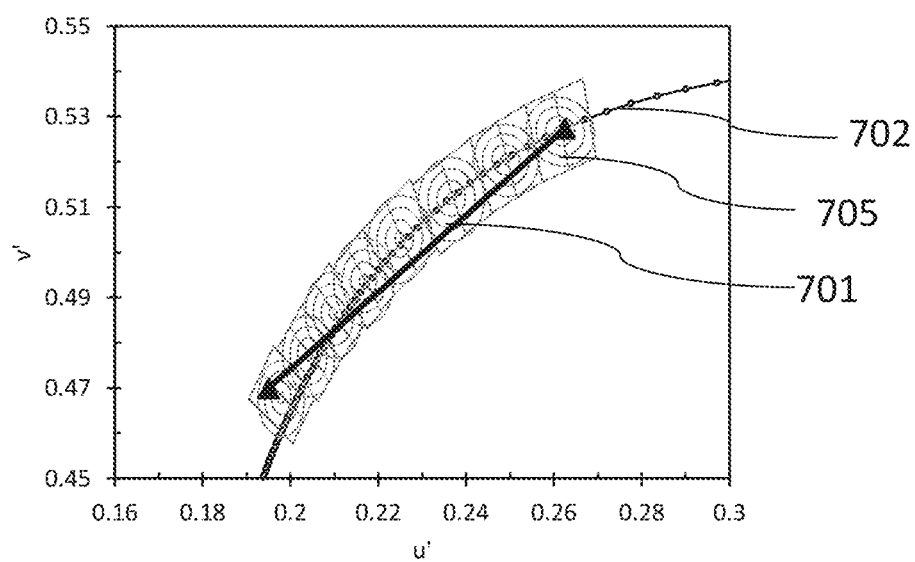
FIG. 7 shows a tuning path in CIE 1976 color space of an example tunable lighting system incorporating the lighting device disclosed herein.

FIG. 7 illustrates the tuning path in CIE 1976 color space of the example embodiment of tunable lighting system 600. The example embodiment of tunable lighting system 600 enables the linear tuning range between these two LEDs 601, 602 shown in FIG. 6. In FIG. 7, curve 702 illustrates the Planckian locus between 2700K and 6500K and line 701 shows the u', v' color of the tunable lighting system as the system is tuned from the first lighting device to the second lighting device, and targets 705 represent standard deviation color matching (SDCM) ellipses, also known as McAdam ellipses, around the center target. Thus, it can be seen from FIG. 7, that tunable lighting system 600 tunes between the warm-white and cool-white color.

Figure 8:
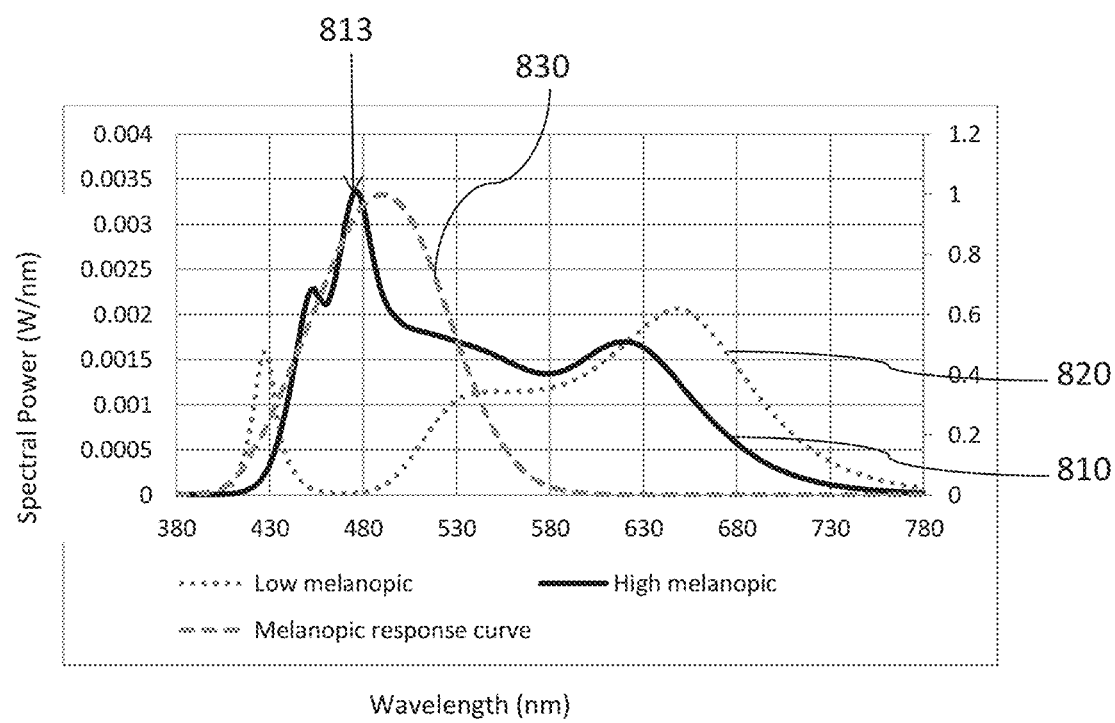
FIG. 8 shows primary spectra of an example tunable lighting system incorporating the lighting device disclosed herein.

FIG. 8 shows the modeled primary spectra for the example embodiment of tunable lighting system 600. Spectrum 810 is from the cool-white, maximum m/p LED as disclosed herein, and Spectrum 820 is from the warm-white, minimum m/p LED. FIG. 8 shows the cyan peak 813 of the cool-white, maximum m/p LED spectrum 820. For comparison, the melanopic response curve 830 is also shown. As can be seen in FIG. 8, the cyan peak 813 of the cool-white, maximum m/p LED is at a wavelength of 475 nm and overlaps with the peak of the melanopic response curve 830.

Figure 9:
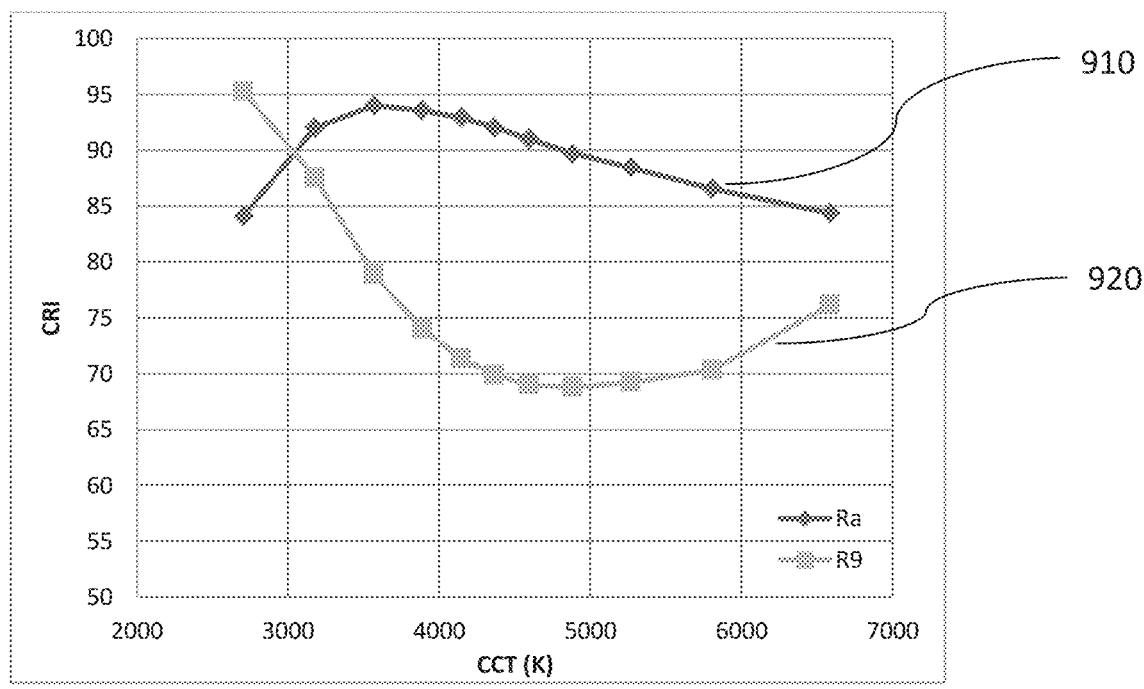
FIG. 9 shows color rendering indices Ra and R9 along the tuning path (CCT) of an example tunable lighting system incorporating the lighting device disclosed herein.

FIG. 9 shows the calculated color rendering indices Ra and R9 along the tuning path (CCT) for the example embodiment of tunable lighting system 600. CRI indices were calculated from the spectral power distribution (CIE 13.3-1995), as understood by persons having ordinary skill in the art. R9 represents the strong red color and is often specified separately because red rendering is an important factor for subjective preference. The color rendering index Ra along the tuning path (curve 910) stays greater than 80 for all CCT (2700K to 6500K), and the color rendering index R9 along the tuning path (curve 920) stays greater than 65. Thus, an Ra>80 and R9>50 can be easily maintained.

Figure 10:
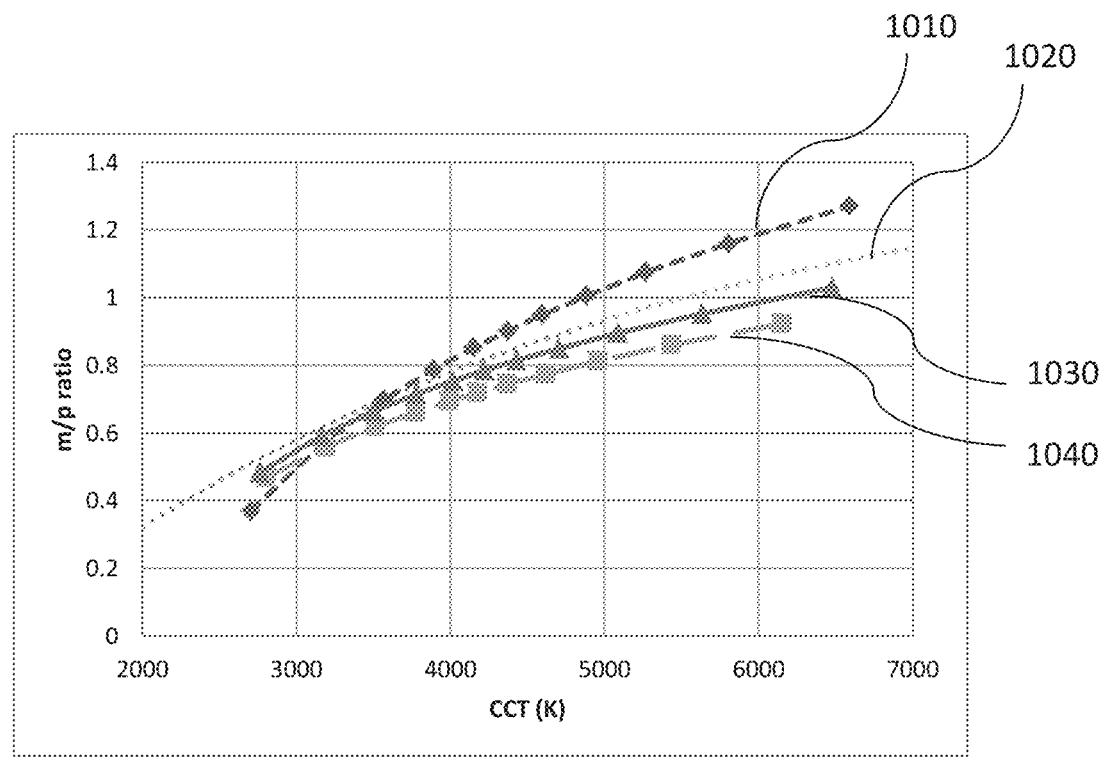
FIG. 10 shows the m/p ratio as a function of CCT for an example tunable lighting system incorporating the lighting device disclosed herein.

FIG. 10 shows the m/p ratio as a function of CCT 910 for the example embodiment of tunable lighting system 600. Curves for a reference illuminant (Planckian radiator below 5000K and the daylight illuminant defined by the CIE D series above 5000K) 1020 and state of the art tunable systems based on standard CRI 80 1030 and CRI 90 1040 LEDs are also included. As shown in this comparison, this tunable lighting system using the cool-white, maximum m/p lighting device disclosed herein significantly widens the range in m/p ratio that is realized with CCT tuning. In particular, the m/p ratio values range from 0.37 when tunable lighting system 600 is at CCT 2700K to 1.27 when tunable lighting system 600 is at CCT 6500K. The m/p ratio values from FIG. 10 are also summarized in Table 1, below for comparison.

TABLE 1

Summary of normalized melanopic range of CCT tuning systems shown in FIG. 10.

| m/p ratio | Low (2700K) | High (6500K) |
|---|---|---|
| Reference illuminant | 0.51 | 1.10 |
| LED: high melanopic range of tunable lighting system 600 | 0.37 | 1.27 |
| LED: standard CRI 80 | 0.47 | 0.92 |
| LED: standard CRI 90 | 0.48 | 1.03 |

This disclosure is illustrative and not limiting. Further modifications will be apparent to one skilled in the art in light of this disclosure and are intended to fall within the scope of the appended claims.

What is claimed is:

1. A lighting device comprising:
   a light source, the light source including a royal-blue light source configured to emit a royal-blue light with a peak wavelength between 435-460 nm and a blue light source configured to emit light with a peak wavelength between 470-496 nm;
   a wavelength converting structure disposed in a path of the royal-blue light and the blue light, the wavelength converting structure including:
      a green phosphor, the green phosphor configured to absorb a first portion of at least one of the royal-blue light and the blue light, and to down-covert the first portion to green light; and
      a red phosphor configured to absorb at least one of a second portion of at least one of the royal-blue light and the blue light and a portion of the green light, and to down-convert the at least one of the second portion and the portion of the green light to red light;
   the wavelength converting structure configured to emit a second light, the second light including the green light, the red light, an unconverted portion of the royal-blue light, and an unconverted portion of the blue light the second light having a spectrum with a maximum spectral power density between 465 and 515 nm.

2. The lighting device of claim 1, further comprising a second blue light source configured to emit light with a peak wavelength range between 470-496 nm.

3. The lighting device of claim 2, wherein a ratio of radiant flux of blue light having wavelengths in the range of 465-495 nm to radiant flux of royal-blue light having wavelengths in the range of 435-465 nm in the second light is between 2.0 and 2.8.

4. The lighting device of claim 1, wherein the royal-blue light source is a royal-blue LED and the blue light source is a blue LED.

5. The lighting device of claim 4, further comprising a lead frame cup package, the royal-blue LED and blue LED being both mounted inside the lead frame cup package, the wavelength converting structure being disposed over the royal-blue LED and blue LED within the lead frame cup package.

6. The lighting device of claim 5, wherein the royal-blue LED and the blue LED are electrically connected in series.

7. The lighting device of claim 1, wherein the royal-blue LED and the blue LED are electrically connected in parallel.

8. The lighting device of claim 1, wherein an m/p ratio of the second light is greater than an m/p ratio of the CIE daylight illuminant at a corresponding CCT value.

9. The lighting device of claim 1, wherein a CCT value of the second light is 4000K or greater and a color rendering index of the second light has an Ra value greater than 80.

10. A tunable lighting system comprising:
   a first lighting device configured to emit a first light, the first light having a first m/p ratio; and
   a second lighting device configured to emit a second light, the second light having a second m/p ratio that is smaller than the first m/p ratio, the tunable lighting system being configured to emit a third light, the third light including at least one of the first light, the second light, or a combination of the first light and the second light,
   the first lighting device comprising:
      a light source, the light source including a royal-blue light source configured to emit a royal-blue light with a peak wavelength between 435-460 nm and a blue light source configured to emit light with a peak wavelength between 470-496 nm; and
      a wavelength converting structure disposed in a path of the royal-blue light and the blue light, the wavelength converting structure including a mixture of a green phosphor and a red phosphor, the green phosphor configured to absorb a first portion of at least one of the royal-blue light and the blue light, and to down-covert the first portion to green light; and the red phosphor configured to absorb at least one of a second portion of at least one of the royal-blue light and the blue light and a portion of the green light, and to down-convert at least one of the second portion and the portion of green light to red light;

the wavelength converting structure being configured to emit the first light, the first light including the green light, the red light, an unconverted portion of the royal-blue light, and an unconverted portion of the blue light.

11. The tunable lighting system of claim 10, wherein the royal-blue light source is a royal-blue LED, the blue light source is a blue LED, and the second lighting device is a violet pumped LED.

12. The tunable lighting system of claim 11, wherein the first lighting device further comprises a lead frame cup package, the royal-blue LED and blue LED both being mounted inside the lead frame cup package, the wavelength converting structure disposed over the royal-blue LED and blue LED within the lead frame cup package.

13. The tunable lighting system of claim 10, wherein a CCT value of the third light is between 2700K and 6500K, and an m/p ratio of the third light is between 0.37 and 1.27.

14. The tunable lighting system of claim 10, wherein a color rendering index Ra value of the third light is greater than 80, and a color rendering index R9 value of the third light is greater than 50.

15. The tunable lighting system of claim 10, wherein the first light has a maximum spectral power density between 465 and 515 nm, and the second light has a minimum spectral power density between 447 nm and 531 nm.

16. The tunable lighting system of claim 10, wherein the red phosphor comprises at least one of $(Sr_{1-x-y}Ba_xCa_y)_{2-z}Si_{5-a}Al_aN_{8-a}O_a:Eu_z^{2+}$ where $0 \leq a<5$, $0<x \leq 1$, $0 \leq y \leq 1$, and $0<z \leq 1$, $Ca_{1-x-z}M_zS:Eu_x$ where M=Ba, Sr, Mg, Mn and $(0<x \leq 0.2)$; $Ca_{1-x-y}M_ySi_{1-1}Al_{1+z}N_{3-z}O_z:Eu_x$ where M=Sr, Mg, Ce, Mn and $(0<x \leq 0.2)$, $Mg_4Ge_{1-x}O_5F:Mn_x$ where $(0<x \leq 0.2)$; $M_{2-x}Si_{5-y}Al_yN_{8-y}O_y:Eu_x$ where M=Ba, Sr, Ca, Mg, Mn and $(0<x \leq 0.2)$; $Sr_{1-x-y}M_ySi_{4-z}Al_{1+z}N_{7-z}O_z:Eu_x$ where M=Ba, Ca, Mg, Mn and $(0<x \leq 0.2)$; and $Ca_{1-x-y}M_ySiN_2:Eu_x$ where M=Ba, Sr, Mg, Mn and $(0<x \leq 0.2)$.

17. The tunable lighting system of claim 10, wherein the green phosphor comprises at least one of $(Lu_{1-x-y-a-b}Y_xGd_y)_3(Al_{1-z}Ga_z)_5O_{12}:Ce_aPr_b$ where $0<x<1$, $0<y<$, $0<z \leq 0.1$, $0<a \leq 0.2$ and $0<b \leq 0.1$, $Lu_{3-x-y}M_yAl_{5-z}A_zO_{12}:Ce_x$ where M=Y, Gd, Tb, Pr, Sm, Dy; A=Ga, Sc; and $(0<x \leq 0.2)$; $Ca_{3-x-y}M^pSc_{2-z}A_zSi_3O_{12}:Ce_x$ where M=Y, Lu; A=Mg, Ga; and $(0<x \leq 0.2)$; $Ba_{2-x-y}M_ySiO_4:Eu_x$ where M=Sr, Ca, Mg and $(0<x \leq 0.2)$; $Ba_{2-x-y-z}M_yK_zSi_{1-z}P_zO_4:Eu_x$ where M=Sr, Ca, Mg and $(0<x \leq 0.2)$; $Sr_{1-x-y}M_yAl_{2-z}Si_zO_{4-z}N_z:Eu_x$ where M=Ba, Ca, Mg and $(0<x \leq 0.2)$; $M_{1-x}Si_2O_2N_2:Eu_x$ where M=Sr, Ba, Ca, Mg and $(0<x \leq 0.2)$; $M_{3-x}Si_6O_9N_4:Eu_x$ where M=Sr, Ba, Ca, Mg and $(0<x \leq 0.2)$; $M_{3-x}Si_6O_{12}N_2:Eu_x$ where M=Sr, Ba, Ca, Mg and $(0<x \leq 0.2)$; $Sr_{1-x-y}M_yGa_{2-z}Al_zS_4:Eu_x$ where M=Ba, Ca, Mg and $(0<x \leq 0.2)$; $Ca_{1-x-y-z}M_zS:Ce_xA_y$ where M=Ba, Sr, Mg; A=K, Na, Li; and $(0<x \leq 0.2)$; $Sr_{1-x-z}M_zAl_{1+y}Si_{4.2-y}N_{7-y}O_{0.4+y}:Eu_x$ where M=Ba, Ca, Mg and $(0<x \leq 0.2)$; $Ca_{1-x-y-z}M_ySc_2O_4:Ce_xA_z$ where M=Ba, Sr, Mg; Na, Li; and $(0<x \leq 0.2)$; $M_{x-z}Si_{6-y-2x}Al_{y+2x}O_yN_{8-y}:Eu_z$ where M=Ca, Sr, Mg and $(0<x \leq 0.2)$; and $Ca_{8-x-y}M_yMgSiO_4Cl_2:Eu_x$ where M=Sr, Ba and $(0<x \leq 0.2)$.

18. The tunable lighting system of claim 10, wherein the green phosphor is $(Lu_{1-x-y-a-b}Y_xGd_y)_3(Al_{1-z}Ga_z)_5O_{12}:Ce_aPr_b$ and the red phosphor is $(Sr_{1-x-y}Ba_xCa_y)_{2-z}Si_{5-a}Al_aN_{8-a}O_a:Eu_z^{2+}$ and a ratio of the amount of green phosphor to red phosphor is approximately 21:1.

19. The tunable lighting system of claim 10, wherein the first m/p ratio is below the m/p ratio of the CIE daylight illuminant at CCT values below 3000K, and the second m/p ratio is above the m/p ratio of the CIE daylight illuminant at CCT values above 6500K.

* * * * *